(12) United States Patent
Deguchi et al.

(10) Patent No.: US 7,898,332 B2
(45) Date of Patent: Mar. 1, 2011

(54) SEMICONDUCTOR INTEGRATED CIRCUIT DEVICE

(75) Inventors: Jun Deguchi, Kanagawa (JP); Daisuke Miyashita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/560,828

(22) Filed: Sep. 16, 2009

(65) Prior Publication Data
US 2010/0109781 A1    May 6, 2010

(30) Foreign Application Priority Data
Nov. 6, 2008   (JP)   ............................. 2008-285858

(51) Int. Cl.
*H03F 3/45* (2006.01)
(52) U.S. Cl. ...................................... 330/259; 330/261
(58) Field of Classification Search ................ 330/259, 330/260, 261, 285, 296
See application file for complete search history.

(56) References Cited

U.S. PATENT DOCUMENTS 5,493,253 A * 2/1996 Ogou ........................ 330/256
7,109,794 B2 * 9/2006 Killat ......................... 330/253
7,391,263 B2 * 6/2008 Koizumi et al. ............. 330/253
7,525,381 B2 * 4/2009 Murden et al. .............. 330/261

OTHER PUBLICATIONS

D. Yamazaki, et al., "2.5-GHz Fully-Integrated WiMAX Transceiver IC for a Compact, Low-Power-Consumption RF Module", 2008 IEEE Radio Frequency Integrated Circuits Symposium, pp. 109-112. (pp. 110, Fig. 2).

* cited by examiner

Primary Examiner—Henry K Choe
(74) Attorney, Agent, or Firm—Oblon, Spivak, McClelland, Maier & Neustadt, L.L.P.

(57) ABSTRACT

A semiconductor integrated circuit device includes: an amplifier circuit which respectively has one or more input terminals and one or more output terminals; a replica circuit which has the same DC characteristics as those of the amplifier circuit; a reference voltage generation circuit which is connected to a bias terminal of the replica circuit, and which generates a predetermined reference voltage at the bias terminal; and a feedback circuit which takes a difference between the reference voltage generated at the bias terminal of the replica circuit and the voltage generated at a bias terminal of the amplifier circuit, and which performs feedback control by providing negative feedback of the difference to the bias terminal of the amplifier circuit so that the voltage generated at the bias terminal of the amplifier circuit is made equal to the reference voltage generated at the bias terminal of the replica circuit.

11 Claims, 9 Drawing Sheets

20C SEMICONDUCTOR INTEGRATED CIRCUIT DEVICE

FIG.12

20D SEMICONDUCTOR INTEGRATED CIRCUIT DEVICE

SEMICONDUCTOR INTEGRATED CIRCUIT DEVICE

CROSS-REFERENCE TO RELATED APPLICATION

This application is based upon and claims the benefit of priority from the prior Japanese Patent Application No. 2008-285858 filed in Japan on Nov. 6, 2008; the entire contents of which are incorporated herein by reference.

BACKGROUND OF THE INVENTION

1. Field of the Invention

The present invention relates to a semiconductor integrated circuit device which is capable of securing desired transistor characteristics and realizing the class AB bias.

2. Description of Related Art

There is a case where a class AB biasing method is adopted in an amplifier requiring high linearity. In the case of a high frequency input signal (for example, 2.4 GHz), the class AB bias can be realized, for example, as follows. An alternating current (hereinafter referred to as AC) signal supplied through a capacitive coupling and a direct current (hereinafter referred to as DC) bias signal supplied through a resistor are superimposed on each other, so as to be inputted into the gate of a transistor whose source is grounded to a reference potential, such as GND. Here, desired characteristics of the amplifier (transistor) can be obtained by generating a DC bias by using, for example, a current mirror circuit biased by a current source that maintains constant transconductance (gm). With this configuration, when the input amplitude of the AC signal inputted into the gate of the transistor is increased, the DC output current of the transistor is also increased, so that the amplifier can be class AB biased (see, for example, D. Yamazaki, et al., "2.5-GHz fully integrated WiMAX transceiver IC for compact low-power-consumption RF module", IEEE Radio Frequency Integrated Circuits Symposium, pp. 109-pp. 112, and 2008, (pp. 110, FIG. 2)).

However, there is a problem that in the same configuration, when the input signal is a low frequency signal (for example, 5 MHz), and when the AC signal is to be capacitively coupled by a capacitor, a large capacitance is needed, thereby increasing the circuit scale. Thus, when in order to realize the class AB bias of the amplifier by eliminating the capacitive coupling, the output signal of the preceding stage circuit (=the preceding stage output common mode DC voltage+the preceding stage AC output signal) is directly inputted into the gate of the transistor, the characteristics (such as gm) of the transistor are determined by the common mode voltage of the preceding stage circuit, and hence it is difficult to obtain desired characteristics (such as gm). Here, as a method for obtaining the desired characteristics of the transistor, a method can be considered in which a level shifter is inserted into the preceding stage of the transistor so as to obtain a desired DC level (VDC). However, there newly arises a problem that the distortion is caused and noise characteristics are inevitably deteriorated by inserting the extra circuit. When a configuration is adopted, as another method, in which the current flowing into the source of the transistor is regulated by a constant current source in order to obtain the desired characteristics, the transistor becomes class A biased, so that the linearity is deteriorated.

BRIEF SUMMARY OF THE INVENTION

According to an aspect of the present invention, there is provided a semiconductor integrated circuit device including:

an amplifier circuit which has one or more input terminals, one or more output terminals, and a first bias terminal, and in which a first current or voltage DC signal and a first current or voltage AC signal are superposed on each other, so as to be inputted into the one or more input terminals;

a replica circuit which has the same DC characteristics as the DC characteristics of the amplifier circuit, to which a second current or voltage DC signal is inputted, and which has a second bias terminal;

a reference voltage generation circuit which is connected to the second bias terminal of the replica circuit, and which generates a predetermined reference voltage at the second bias terminal; and a feedback circuit which takes a difference between the reference voltage generated at the second bias terminal of the replica circuit and the voltage generated at the first bias terminal of the amplifier circuit, and which performs feedback control by providing negative feedback of the difference to the first bias terminal of the amplifier circuit so that the voltage generated at the first bias terminal of the amplifier circuit is made equal to the reference voltage generated at the second bias terminal of the replica circuit.

Note that it is preferred that the reference voltage generation circuit is configured by a current source.

According to another aspect of the present invention, there is provided a semiconductor integrated circuit device including: an amplifier circuit that is configured by including first and second input terminals to which first and second input signals formed by respectively superimposing AC signals having opposite polarities on DC signals having the same level are respectively inputted, first and second transistors, which form a differential pair in such a manner that the first and second input signals are respectively inputted into the gates of the transistors, and that the sources of the transistors are commonly connected, first and second loads, one ends of which are respectively connected to the drains of the first and second transistors, and the other ends of which are connected to a DC voltage source, and first and second output terminals which are respectively connected to the drains of the first and second transistors, so as to take out output signals; a replica circuit that is configured by including a third transistor, to the gate of which a DC signal having the same level as the DC component of the input signal inputted into the gates of the first and second transistors is inputted, and a third load, one end of which is connected to the drain of the third transistor, and the other end of which is connected to the DC voltage source, and that is configured such that the third transistor has the same DC characteristics as the DC characteristics of the first and second transistors of the amplifier circuit; a reference voltage generation circuit that is configured by a current source provided between the source of the third transistor of the replica circuit and a reference potential point, and that is configured to generate a reference voltage corresponding to the current source at the connection point of the source of the third transistor and the current source; a feedback circuit that is configured by including a fourth transistor, the drain and source of which are respectively connected between the commonly connected sources of the first and second transistors of the amplifier circuit and the reference potential point, and which controls the current flowing between the drain and the source of the fourth transistor by a voltage inputted into the gate of the fourth transistor, and a difference circuit which takes a difference between the reference voltage generated at the source of the third transistor of the replica circuit and a voltage generated at the commonly connected sources of the first and second transistors of the amplifier circuit, and that is configured to perform negative feedback control by inputting the difference into the gate of the fourth transistor so that the voltage at the commonly connected sources of the first and second transistors is made equal to the reference voltage generated at the source of the third transistor of the replica circuit.

Note that a circuit which makes variable the transconductance (gm) of the fourth transistor may also be provided.

According to another aspect of the present invention, there is provided a semiconductor integrated circuit device including: an amplifier circuit that is configured by including a first input terminal to which a first input signal formed by superimposing an AC signal on a DC signal is inputted, a first transistor to the gate of which the first input signal is inputted, a first load one end of which is connected to the drain of the first transistor, and the other end of which is connected to a DC voltage source, and a first output terminal which is connected to the drain of the first transistor to take out an output signal; a replica circuit that is configured by including a third transistor to the gate of which a DC signal of the same level as the DC component of the input signal inputted into the first transistor is inputted, and a third load one end of which is connected to the drain of the third transistor, and the other end of which is connected to the DC voltage source, and that is configured such that the third transistor has the same DC characteristics as the DC characteristics of the first transistor of the amplifier circuit; a reference voltage generation circuit that is configured by a current source provided between the source of the third transistor of the replica circuit and a reference potential point, and that is configured to generate a reference voltage corresponding to the current source at a connection point of the source of the third transistor and the current source; and a feedback circuit that is configured by including a fourth transistor, the drain and source of which are respectively connected between the source of the first transistor of the amplifier circuit and the reference potential point, and which controls the current flowing between the drain and source of the fourth transistor by a voltage inputted to the gate of the fourth transistor, and a difference circuit which takes a difference between the reference voltage generated at the source of the third transistor of the replica circuit and the voltage generated at the source of the first transistor of the amplifier circuit, and that is configured to perform negative feedback control by inputting the difference into the gate of the fourth transistor so that the source voltage of the first transistor is made equal to the reference voltage generated at the source of third transistor of the replica circuit.

DETAILED DESCRIPTION OF THE INVENTION

Before describing embodiments according to the invention, there will be described a related art as a background of the present invention with reference to FIG. 14 to FIG. 18.

Figure 14:
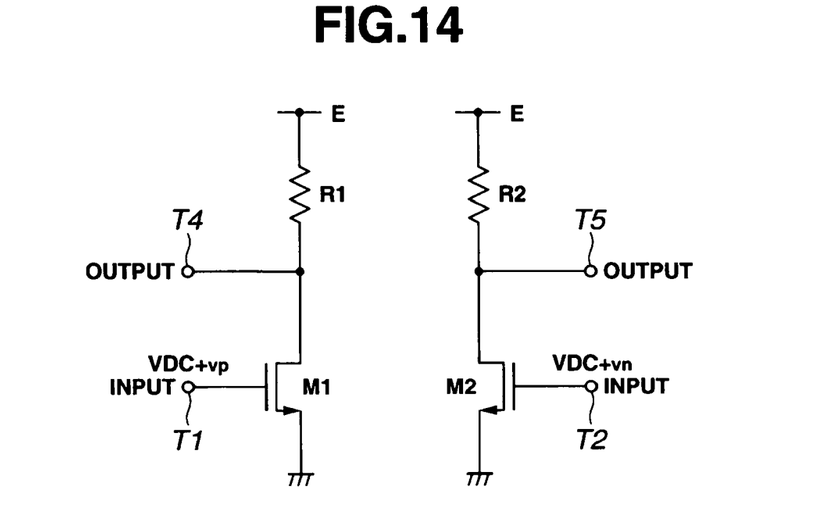
FIG. 14 is a diagram showing an example of a configuration of an amplifier circuit device which is class AB biased.

First, the class AB bias will be described with reference to FIG. 14 and FIG. 15. FIG. 14 shows an amplifier circuit device which is configured by differential transistors M1 and M2, load resistors R1 and R2 which are respectively connected in series to the drains of the differential transistors, and a DC voltage source E (represented by a power source line). Here, it is assumed that each of the differential transistors M1 and M2 is an N-channel FET (for example, NMOS transistor). Signals (VDC+vp, VDC+vn), which are obtained by respectively adding AC signals (hereinafter referred to as vp and vn) having opposite polarities to a DC bias VDC, are inputted into the gates of the differential transistors M1 and M2, respectively.

Figure 15:
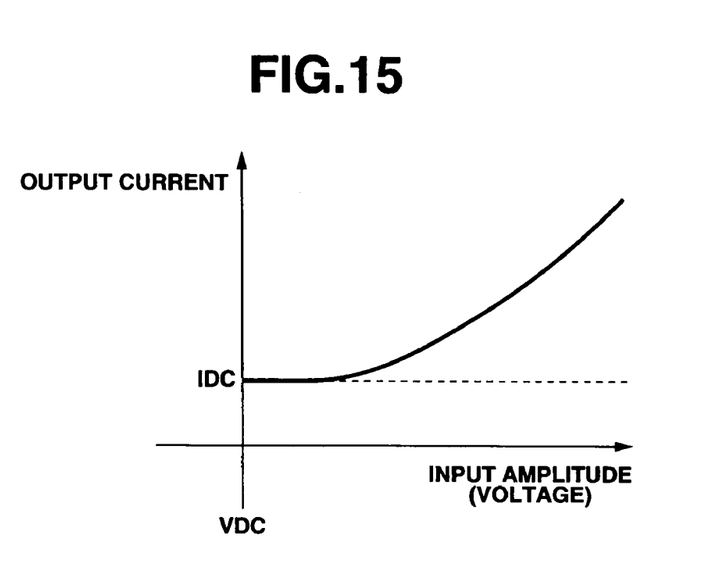
FIG. 15 is a diagram for explaining the class AB bias and the linearity.

FIG. 15 is a diagram which serves to explain an operation of the amplifier circuit device shown in FIG. 14, in which the horizontal axis represents the amplitude of the AC input signal inputted into the gate, and in which the vertical axis represents the DC output current of the differential transistors M1 and M2. When the AC component is set to 0, DC current IDC is made to flow as the drain current of each of the differential transistors M1 and M2 on the basis of the DC bias voltage VDC. The DC output current is increased according to the increase in the input amplitude of the AC component. The input-output state, in which the DC output current is increased from the initial value of IDC based on the DC bias VDC according to the increase in the AC input amplitude in this way, is referred to as the class AB amplification or the class AB bias. On the other hand, the class A bias is configured to allow a constant DC current to be always outputted. Thus, when the AC input amplitude becomes large in the class A bias, the output current becomes insufficient, so as to deteriorate the linearity of the amplifier. Therefore, there is a case where a class AB biasing method is adopted in an amplifier requiring high linearity.

Figure 16:
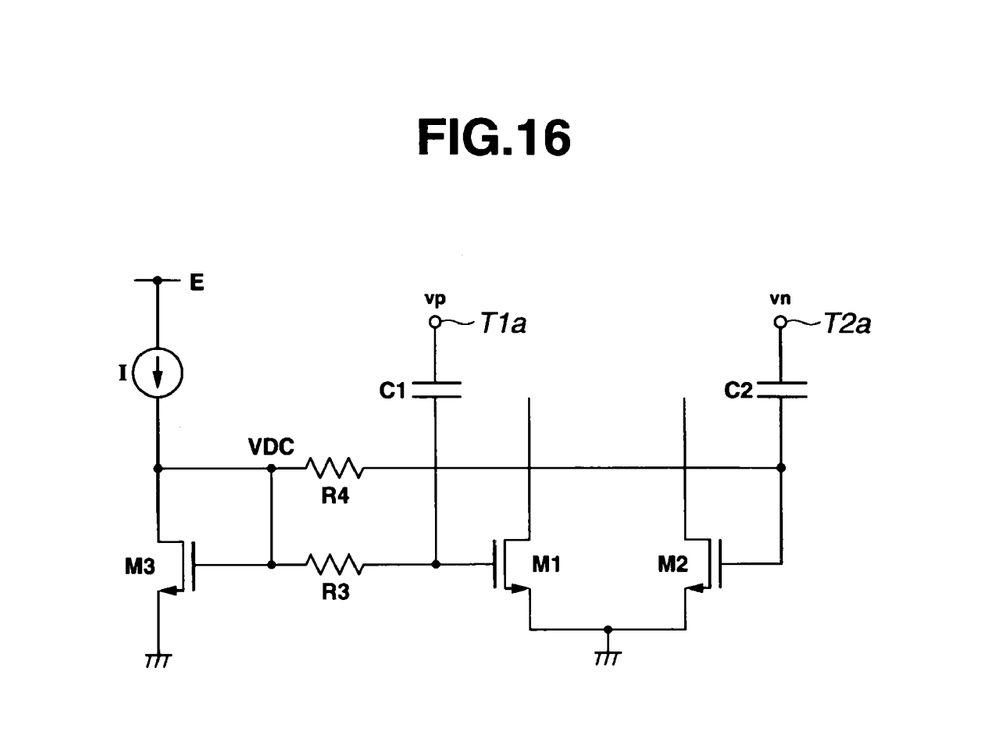
FIG. 16 is a diagram showing an example of a configuration of a high frequency signal amplifier circuit which is class AB biased.

For example, in the case where the input AC signal is a high frequency signal (for example, 2.4 GHz), a class AB biased amplifier circuit device is used as shown in FIG. 16. The circuit shown in FIG. 16 is configured by including: a DC bias generation circuit having a DC voltage source E, a current source I, an FET transistor M3, and resistors R3 and R4; AC signal input terminals T1a and T2a; differential transistors M1 and M2; and capacitors C1 and C2 used to respectively input only AC signal components vp and vn into the gates of the differential transistors M1 and M2.

In FIG. 16, in the case where the input signal is a high frequency signal, only the AC signal components vp and vn are extracted through the capacitors C1 and C2, and are then superimposed on a DC bias VDC, so as to be respectively inputted into the gates of the differential transistors M1 and M2. The characteristics (such as gm) of the transistors M1 and M2 are determined by the current source (for example, gm constant current source) I. Reference characters vp and vn denote input AC signals, and reference character VDC denotes a DC bias for the gate of the transistors M1 and M2. By changing the current value of the gm constant current source I, the DC bias VDC can be set to a desired value corresponding to the current value.

Figure 17:
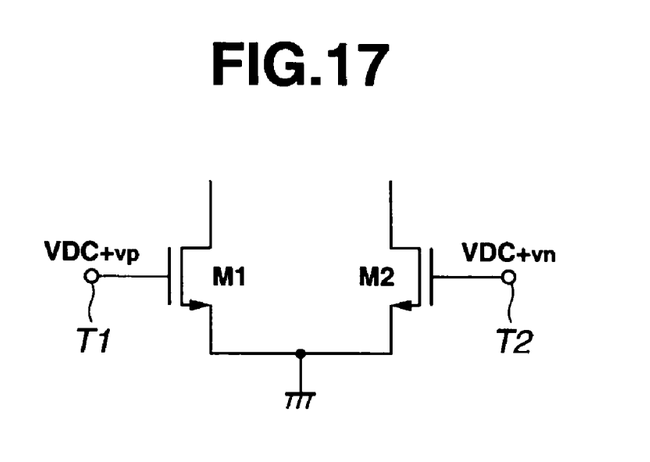
FIG. 17 is a diagram showing an example of a configuration of a low frequency signal amplifier circuit device which is class AB biased.

However, in the case where the input signal is a low frequency signal (for example, 5 MHz), it is difficult to use the amplifier circuit device as shown in FIG. 16. This is because, when the capacitive coupling is to be effected by the capacitors C1 and C2 as shown in FIG. 16 in the case of the low frequency input AC signal, very large capacitors are needed so that the chip area needs to be significantly reduced. Thus, even in the case where the input AC signal is the low frequency signal, a class AB bias can be provided by the use of a configuration as shown in FIG. 17. The voltage VDC as the DC bias and each of the voltages vp and vn as input AC signals are inputted into each of the gates of the transistors M1 and M2. That is, a signal (VDC+vp) is inputted into the gate of the transistor M1, and a signal (VDC+vn) is inputted into the gate of the transistor M2. In this case, the DC bias (VDC) of the gates of the transistors M1 and M2 is, for example, an output common mode voltage of a preceding stage circuit. For this reason, the characteristics (such as gm) of the transistors M1 and M2 are determined by the common mode voltage of the preceding stage circuit, and hence the characteristics of the transistors M1 and M2 are greatly varied by variations in threshold value, temperature, and the like.

Here, as a method to obtain desired characteristics of the differential transistors M1 and M2 shown in FIG. 17, it can be considered a method in which a desired DC level (VDC) is obtained by inserting a level shifter in the preceding stage. However, there newly arises a problem that distortion is caused and noise characteristics are inevitably deteriorated by the insertion of the extra circuit. When the current flowing into the source of the differential transistors M1 and M2 is regulated by a constant current source as another method to obtain the desired characteristics, the output current is not increased and limited to a substantially constant value even in the case where the input amplitude of the AC signal is increased. Thereby, the differential transistors M1 and M2 are class A biased, so that the linearity thereof is deteriorated.

Figure 18:
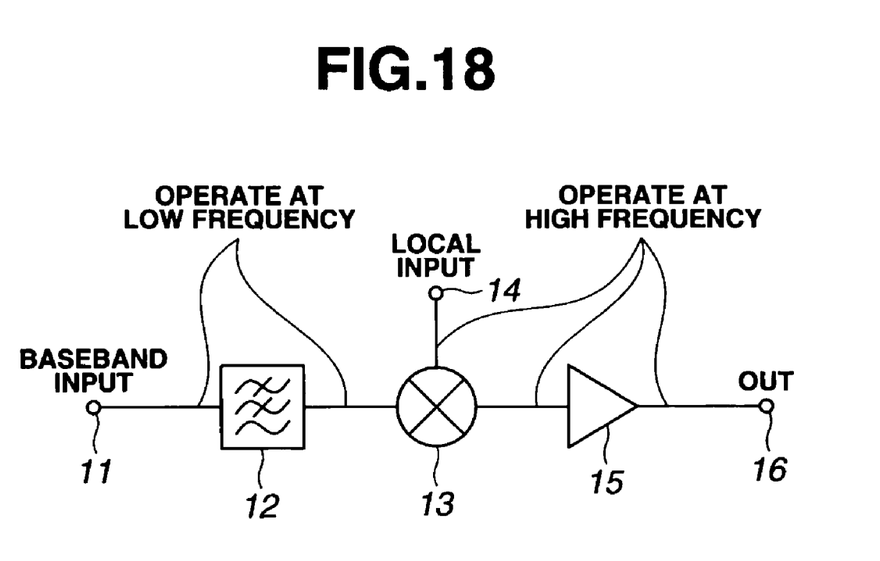
FIG. 18 is a diagram showing an example of a configuration of a wireless transmitter to which the circuit shown in FIG. 16 or FIG. 17 and the circuits according to the present invention are applied.

Such a case may be caused, for example, in an input stage transistor circuit of a mixer circuit 13 in a wireless transmitter shown in FIG. 18.

FIG. 18 shows an example of a configuration of a wireless transmitter to which the circuit device shown in FIG. 16 or FIG. 17 is applied. Circuit devices according to the present invention as will be described below can also be applied to the wireless transmitter shown in FIG. 18. As the wireless transmitter, a portable telephone, a wireless LAN, and the like are examples.

In FIG. 18, the wireless transmitter includes: an input terminal 11 to which a baseband input signal is inputted; a low pass filter (hereinafter referred to as LPF) 12 which passes low frequency components of the inputted baseband signal; an input terminal 14 to which a high frequency signal from a local oscillator (not shown) is inputted; a mixer circuit 13 which generates a high frequency modulated signal by mixing the high frequency signal inputted into the input terminal 14 with the low frequency signal outputted from the LPF 12; an output amplifier 15 which amplifies the modulated signal from the mixer circuit 13 to output the amplified modulated signal; and an output terminal 16 which outputs the amplified modulated signal to an antenna (not shown). In FIG. 18, the common mode voltage of the low pass filter (LPF), which is operated at the baseband frequency (low frequency), is used as the DC bias for the gate of the input transistor (corresponding to the differential transistors M1 and M2 in FIG. 17) in the mixer circuit 13, and the low frequency AC signal from the LPF 12 is inputted into the gate of the input transistor.

Thus, according to the present invention, there is provided a semiconductor integrated circuit device that secures desired transistor characteristics (such as gm) of a transistor circuit of an amplifier circuit, and the like, the gate of which is biased at a certain DC voltage value as in the case of the input stage transistor circuit of the mixer circuit 13 shown in FIG. 18, and that realizes the class AB bias.

In the following, embodiments according to the present invention will be described with reference to FIG. 1 to FIG. 13.

Figure 1:
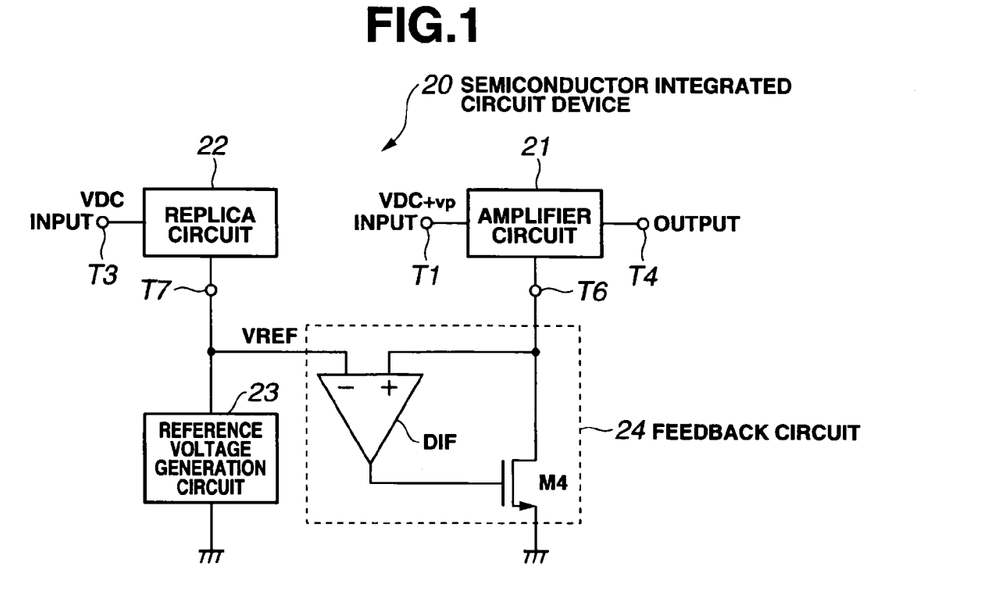
FIG. 1 is a block diagram of a semiconductor integrated circuit device according to the present invention.

FIG. 1 is a block diagram of a semiconductor integrated circuit device according to the present invention.

In FIG. 1, a semiconductor integrated circuit device 20 includes: an amplifier circuit 21 which has an input terminal T1, an output terminal T4, and a bias terminal T6; a replica circuit 22 which has the same DC characteristics as those of the amplifier circuit 21, and which has an input terminal T3 and a bias terminal T7; a reference voltage generation circuit 23 which is connected to the bias terminal T7 and which generates a predetermined reference voltage at the bias terminal T7; and a feedback circuit 24 which takes a difference between the reference voltage generated at the bias terminal T7 of the replica circuit 22 and the voltage generated at the bias terminal T6 of the amplifier circuit 21, and which performs feedback control by providing negative feedback of the difference to the bias terminal T6 of the amplifier circuit 21 so that the voltage generated at the bias terminal T6 is made equal to the reference voltage generated at the bias terminal T7 of the replica circuit 22.

The amplifier circuit 21 may have one or more input terminals and one or more output terminals. A first current or voltage DC signal and a first current or voltage AC signal are superimposed on each other, so as to be inputted into the one or more input terminals.

A second current or voltage DC signal is inputted into the input terminal T3 of the replica circuit 22.

Here, the first current or voltage DC signal is a DC voltage having a predetermined value, and the second current or voltage DC signal is a voltage equivalent to the DC voltage of the first current or voltage DC signal.

The reference voltage generation circuit 23 is configured by, for example, a current source I. Further, the feedback circuit 24 includes a differential amplifier DIF as a difference circuit which takes a difference between the reference voltage VREF generated by the reference voltage generation circuit 23 and the voltage generated at the bias terminal T6 of the amplifier circuit 21, and a feedback control transistor M4 which is provided between the bias terminal T6 and a reference potential point in order to provide negative feedback of the difference to the bias terminal T6 of the amplifier circuit 21.

First Embodiment

Figure 2:
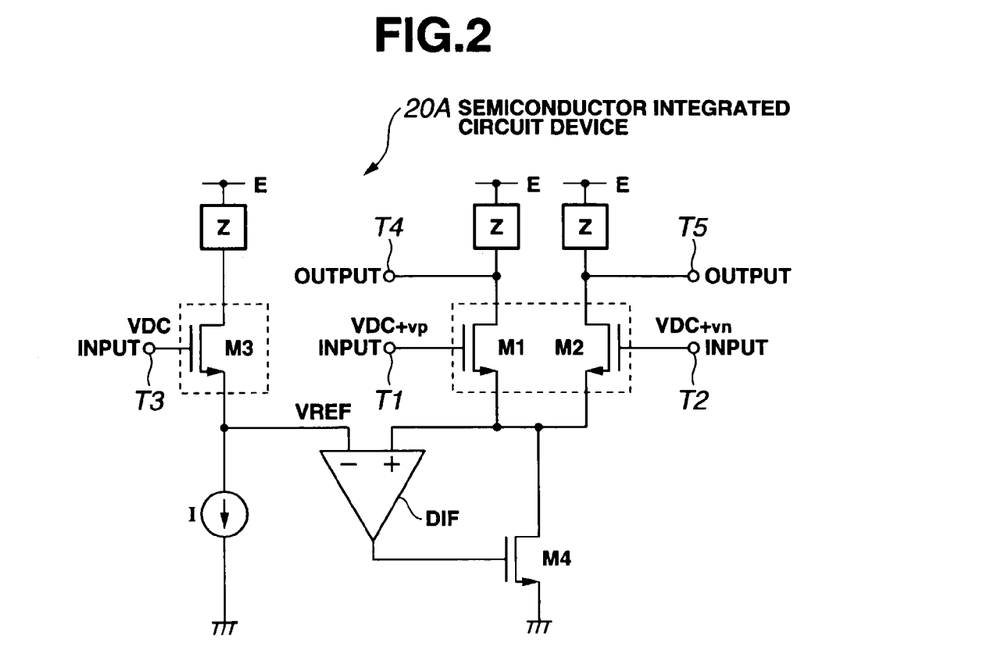
FIG. 2 is a block diagram of a semiconductor integrated circuit device according to a first embodiment of the present invention.

FIG. 2 is a block diagram of a semiconductor integrated circuit device according to a first embodiment of the present invention.

In the semiconductor integrated circuit device 20A shown in FIG. 2, are provided differential transistors M1 and M2 which form a differential pair as signal input transistors, and the sources of which are commonly connected to each other so as to be connected to the drain of a transistor M4. A transistor M3 is a replica of the transistors M1 and M2. The source of the transistor M3 serving as the replica of the differential transistors M1 and M2 is connected to a current source I. The source of transistor M3, and the common source of the differential transistors M1 and M2 are respectively connected to two input terminals of a differential amplifier DIF. The output terminal of the differential amplifier DIF is connected to the gate of the transistor M4. That is, the source voltage of the transistor M3, and the source voltage of the differential transistors M1 and M2 are respectively inputted into ± input terminals of the differential amplifier DIF, so that the difference output between the source voltages is inputted into the gate of the transistor M4. The source of the transistor M4 is connected to a reference potential point. The drain of each of the transistors M1, M2 and M3 is connected to a DC voltage source E via a load Z. A DC bias (VDC) and each of AC signals (vp, vn) are inputted into each of input terminals T1 and T2 which are respectively connected to the gates of the differential transistors M1 and M2, while the same DC bias (VDC) as that inputted into the gates of the differential transistors M1 and M2 is inputted into an input terminal T3 connected to the gate of the transistor M3. The VDC inputted into the gate of the transistor M3 is, for example, the common mode voltage of the preceding stage circuit. Note that each of the transistors M1 to M4 is here an N-channel FET (for example, NMOS transistor).

Figure 3:
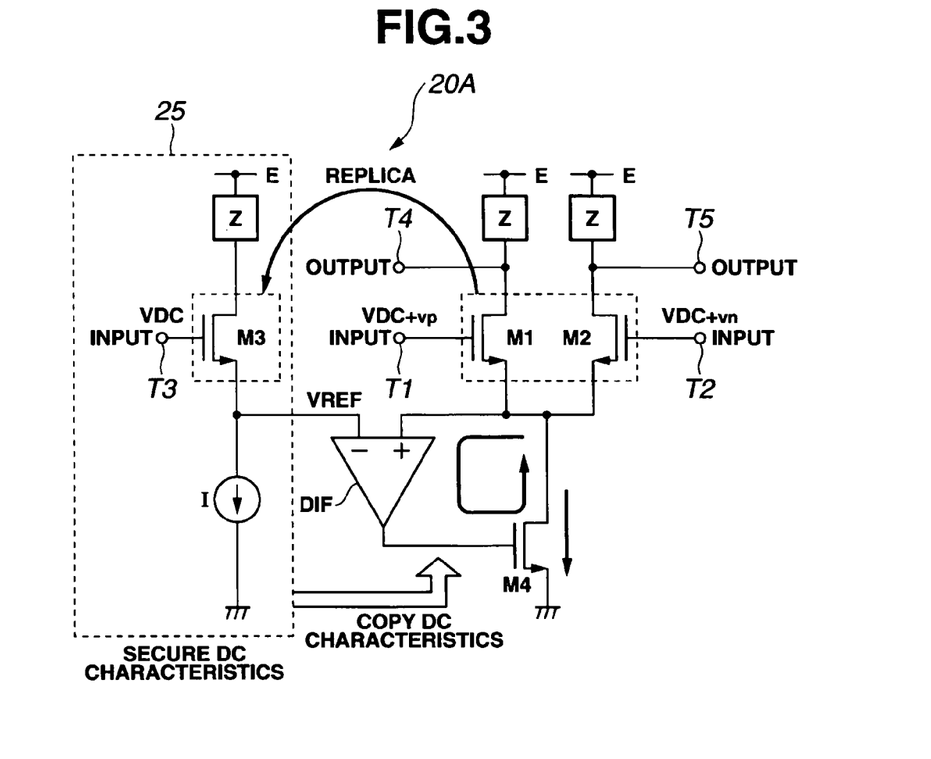
FIG. 3 is a diagram for explaining the operation of the semiconductor integrated circuit device shown in FIG. 2.

Next, with reference to FIG. 3, operational effects of the semiconductor integrated circuit device shown in FIG. 2 will be described. FIG. 3 is a diagram for explaining an operation of the semiconductor integrated circuit device shown in FIG. 2.

In FIG. 3, a circuit 25 surrounded by a dotted line is provided in order to secure the DC characteristics of the differential transistors M1 and M2 which are the main transistors of the semiconductor integrated circuit device 20A. In the circuit 25, the load Z, the transistor M3, and the current source I are connected in series between the DC voltage source E and the reference potential point. The DC component VDC taken out from the output of the preceding stage circuit (not shown) is inputted into the gate of the transistor M3, but the characteristics (such as gm) of the transistor M3 is determined by the current source I as a constant current source. Thus, the circuit 25 operates in such a manner that the current flowing through the circuit 25 surrounded by the dotted line is held to a constant current value determined by the current source I, and that the overdrive voltage (=the gate-source voltage−the transistor threshold voltage) of the transistor M3 is held to a constant value. That is, the characteristics (gm) of the transistor M3 are determined by the current of the current source I, independently of the DC voltage VDC which is inputted into the gate of the transistor M3 from the preceding stage circuit. That is, if the source of the transistor M3 is directly connected to the reference potential point by eliminating the current source I in the circuit portion surrounded by the dotted line, the overdrive voltage of the transistor M3 is changed according to the DC component VDC from the preceding stage circuit. As a result, the characteristics (gm) of the transistor M3 are also determined by the DC component VDC from the preceding stage circuit, so that the characteristics of the transistor M3 are changed by the DC component VDC from the preceding stage circuit. The embodiment according to the present invention is configured such that the bias of the transistor M3 is not determined by the DC component VDC inputted into the gate of the transistor M3 from the preceding stage circuit, but is determined by the current of the current source I connected to the source of the transistor M3.

Further, the embodiment according to the present invention is configured such that feedback control is performed via the transistor M4 so that the source potential of the differential transistors M1 and M2 is made equal to the potential (that is the reference voltage) VREF of the source of the transistor M3 by the differential amplifier DIF. That is, for example, when the potential of the common source of the differential transistors M1 and M2 becomes higher than the source potential VREF of the transistor M3, the positive difference value between the potentials is inputted into the gate of the transistor M4 from the differential amplifier DIF. As a result, the drain current flowing through the transistor M4 is increased, and the drain current of each of the differential transistors M1 and M2 is also increased so as to lower the common source potential. Thereby, the negative feedback is performed so as to make the common source potential approach the reference voltage VREF. Therefore, when the frequency band of the feedback performed by the differential amplifier DIF is wider than the signal frequency band, the source of the differential transistors M1 and M2 is grounded at the reference potential VREF, so that the differential transistors M1 and M2 are in the state of being class AB biased. Further, the transistor M3 is DC biased by the current source I, for example, a constant-gm current source, and hence the gm of the transistor M3 is made constant independently of variations in the VDC, threshold value, temperature, and the like. Further, the overdrive voltage of the differential transistors M1 and M2 is also made equal to the overdrive voltage of the transistor M3 by the feedback performed by the differential amplifier DIF (this is because the transistors M3 serves as a replica of the differential transistors M1 and M2). Therefore, the differential transistors M1 and M2, the DC bias state of which is equal to the DC bias state of the transistor M3, are DC biased in the state of constant gm. Therefore, when the configuration shown in FIG. 2 is used, it is possible to obtain desired characteristics (such as gm) of the differential transistors M1 and M2 by the current source I, in the state where the differential transistors M1 and M2 are class AB biased. In this configuration, it is also possible to prevent distortion and deterioration of noise characteristics, which is caused by the insertion of an extra circuit, such as a level shifter, in the preceding stage as described with reference to FIG. 17. Here, it should be noted supplementarily that the replica transistor M3 needs not be completely the same as the differential transistors M1 and M2. Similarly to a current mirror, the DC bias states of the differential transistors M1 and M2, and the transistor M3 can be adjusted by the size ratio (such as the channel width ratio) between the transistors (and also by changing the size ratio of the loads Z in correspondence with the size ratio of the transistors).

Figure 4:
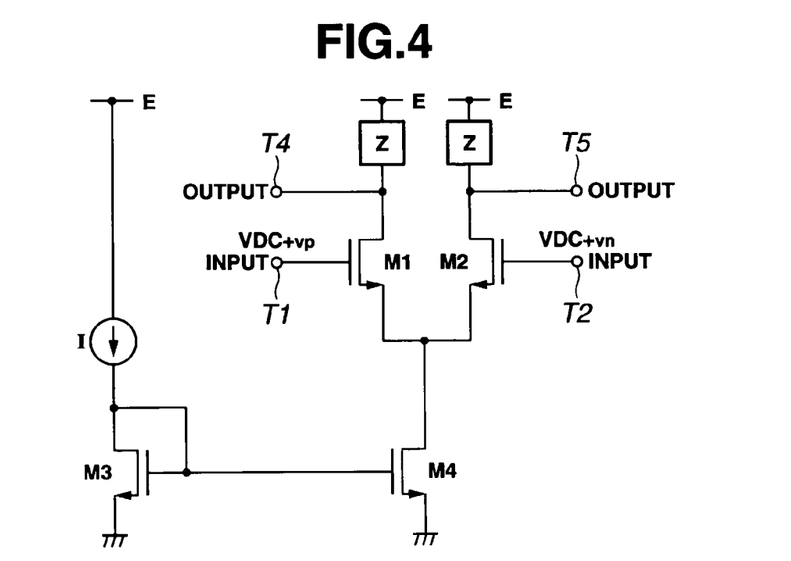
FIG. 4 is a diagram showing, for comparison with FIG. 2, an example of a configuration of a semiconductor integrated circuit device which is class A biased.

A circuit simulation was performed in order to confirm the above described functions. For comparison with the configuration shown in FIG. 2, a description will be made on simulation results of a configuration shown in FIG. 4 together with the simulation results of the configuration shown in FIG. 2. FIG. 4 shows an example of a configuration in which the circuit shown in FIG. 2 is class A biased.

In FIG. 4, the differential amplifier DIF in FIG. 2 is eliminated, and a current mirror is configured in such a manner that the current source I and the transistor M3 whose drain and gate are diode-connected, are connected in series between the DC voltage source E and the reference potential point, and that the gate of the transistor M3 is commonly connected to the gate of the transistor M4. The other portions are configured similarly to those shown in FIG. 2.

In such configuration, the DC bias states (such as gm) of the differential transistors M1 and M2 shown in FIG. 4 are made equivalent to those of the differential transistors M1 and M2 shown in FIG. 2 by mirroring the current of the current source I. Therefore, the current which flows through the differential transistors M1 and M2, that is, the current which flows through the transistor M4, is regulated by the current source I. Thus, even when the AC input amplitude (vp-vn) is increased, the DC current which flows through the transistor M4 is hardly increased. The DC bias state (gm) of the differential transistors M1 and M2 in FIG. 2 is the same as the DC bias state (gm) of the differential transistors M1 and M2 in FIG. 4. However, the differential transistors M1 and M2 in FIG. 2 are class AB biased, while the differential transistors M1 and M2 in FIG. 4 are class A biased.

Figure 5:
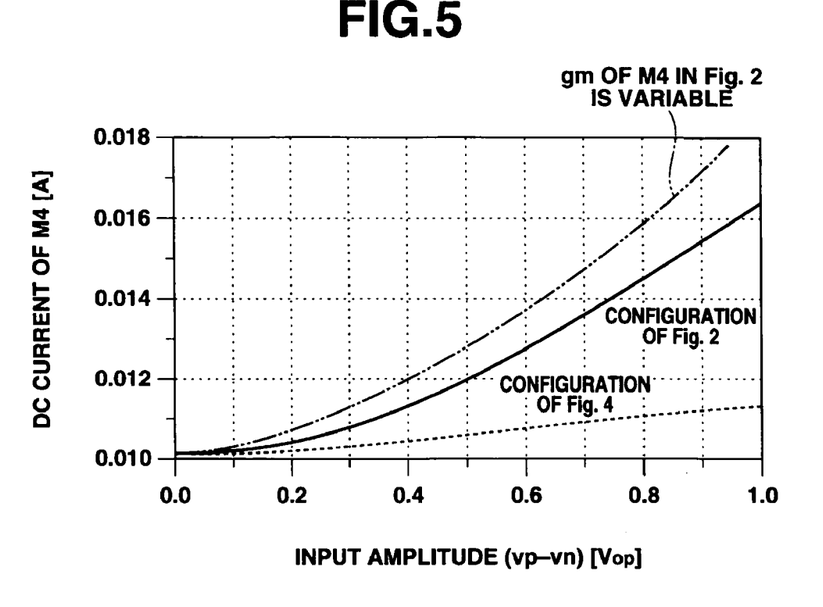
FIG. 5 is a diagram showing a change in the DC current of the transistor M4 with respect to the AC input amplitude (vp−vn)

FIG. 5 shows the state of change of the DC current flowing through the transistor M4 with respect to the AC input amplitude (vp-vn).

As shown in FIG. 5, it is seen that in the configuration shown in FIG. 2, the DC current through flowing the transistor M4 is also increased with the increase in the AC input amplitude and that the transistor M4 is hence class AB biased. On the other hand, it is seen that also in the configuration shown in FIG. 4, the DC current flowing through the transistor M4 is slightly increased with the increase in the AC input amplitude and that the transistor M4 seems to be operated in class AB. However, in actuality, the transistor M4 is operated in class A, as can be clearly seen from FIG. 6.

Figure 6:
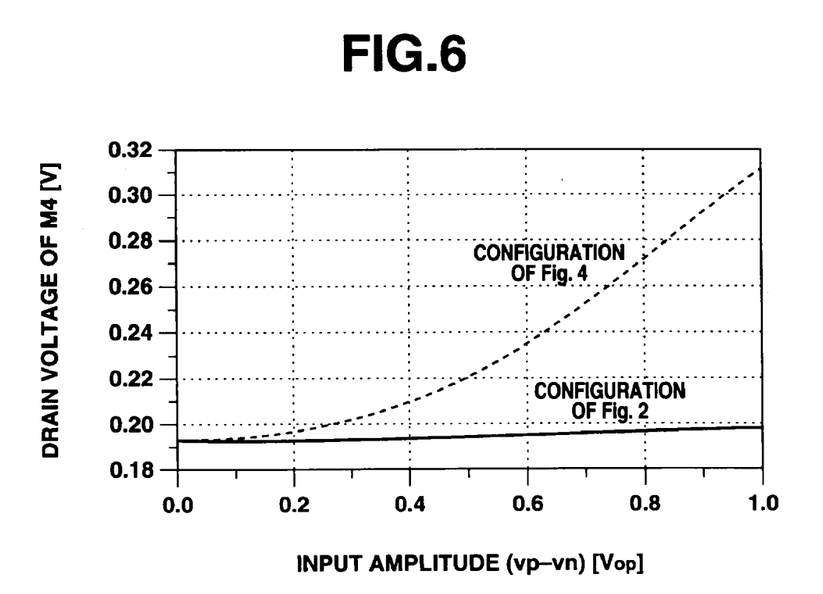
FIG. 6 is a diagram showing a change in the drain voltage of the transistor M4 with respect to the AC input amplitude (vp−vn)

FIG. 6 shows the state of change of the drain voltage of the transistor M4 with respect to the AC input amplitude (vp-vn).

As shown in FIG. 6, in the circuit configuration shown in FIG. 4, the drain voltage of the transistor M4 is increased with the increase in the AC input amplitude. Therefore, it is seen that the increase in DC current of the transistor M4 in the circuit configuration shown in FIG. 4 is caused by the channel length modulation of the transistor M4. That is, it can be said that in the circuit configuration shown in FIG. 4, the drain voltage of the transistor M4 is increased with the increase in the AC input amplitude, thereby causing the transistor characteristics (such as gm) of the differential transistors M1 and M2 to be distorted. On the other hand, the degree of distortion in the transistor characteristics of the differential transistors M1 and M2 in the configuration shown in FIG. 2 is smaller compared with that in the configuration shown in FIG. 4.

Figure 7:
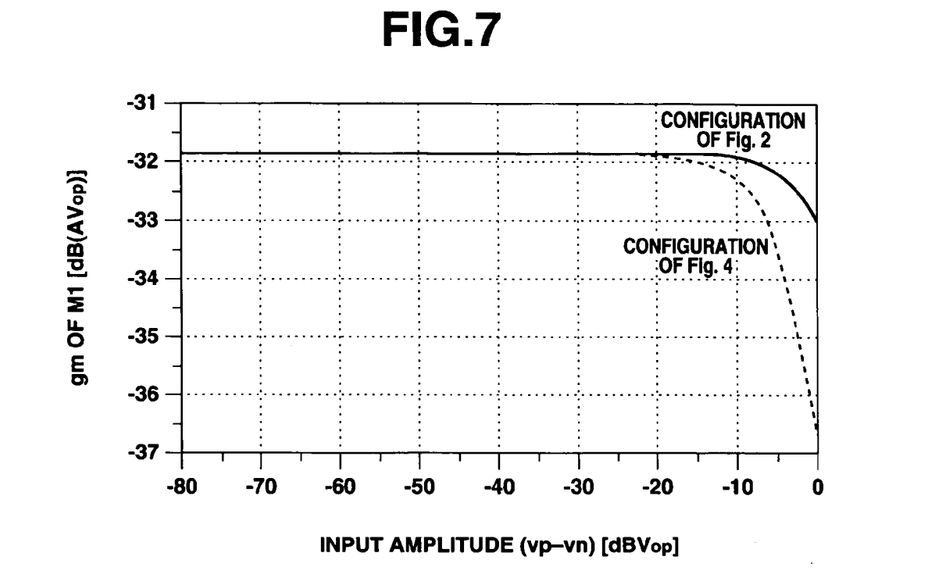
FIG. 7 is a diagram showing a change in the transconductance (gm) of the transistor M1 with respect to the AC input amplitude (vp−vn)

FIG. 7 shows the state of change of the transconductance (gm) of the transistor M1 with respect to the AC input amplitude (vp-vn).

As shown in FIG. 7, it is seen that when the AC input amplitude is small, the gm of the transistor M1 in the configuration shown in FIG. 2 is equal to that in the configuration shown in FIG. 4. That is, it is seen from FIG. 5 that in the configuration shown in FIG. 2, the differential transistors M1 and M2 can be class AB biased. Also, it is seen from FIG. 7 that in the configuration shown in FIG. 2, the differential transistors M1 and M2 can be set to a desired bias state (such as constant gm). Further, as described above, the degree of deterioration and distortion in the characteristics (gm), which are caused by the increase in the AC input amplitude, is smaller in the configuration shown in FIG. 2 than in the configuration shown in FIG. 4.

Figure 8:
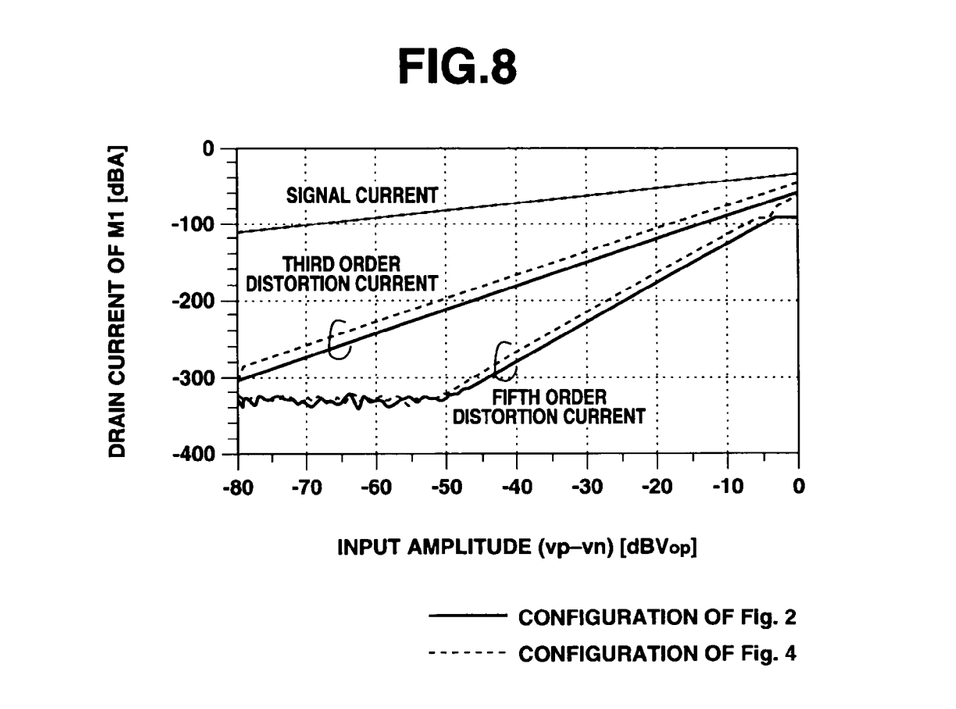
FIG. 8 is a diagram showing the output drain current of the transistor M1 with respect to the AC input amplitude (vp−vn)

FIG. 8 shows the AC output drain current of the transistor M1 with respect to the AC input amplitude.

As shown in FIG. 8, it is seen that although the signal current is the same both in the configurations shown in FIG. 2 and FIG. 4, the third-order distortion current and the fifth-order distortion current are smaller by about 14 dB in the configuration shown in FIG. 2 than in the configuration shown in FIG. 4. That is, similarly to the results shown in FIG. 7, it can be said that the characteristics are less likely to be distorted in the configuration shown in FIG. 2 than in the configuration shown in FIG. 4.

Further, the circuit configuration shown in FIG. 2 is suitable for the reduction in the power source voltage corresponding to the future progress in the CMOS process. As compared with the configuration shown in FIG. 4, extra current is consumed in the replica circuit and the differential amplifier in the configuration shown in FIG. 2. When the DC bias current in FIG. 4 is increased by the amount corresponding to the extra current, the linearity can be surely improved even in the configuration shown FIG. 4. However, when the power source voltage is low, and when the DC bias current is increased, the drain voltage of the differential transistors M1 and M2 is lowered, so that the differential transistors M1 and M2 are made inoperable in the saturation region. On the other hand, the circuit shown in FIG. 2 is configured such that the linearity is improved not by directly increasing the DC bias current which flows into the differential transistors M1 and M2, but by flowing the corresponding amount of current into the replica circuit and the differential amplifier. That is, as compared with the configuration shown in FIG. 4, the configuration shown in FIG. 2, in which the linearity can be improved without changing the operation point of the differential transistors M1 and M2, is hence suitable for a low power source voltage.

According to the first embodiment, the source potential of the main transistors M1 and M2 is controlled by using the replica transistor M3. Thereby, it is possible to secure desired transistor characteristics of the transistors which are used in the amplifier circuit, and the like, and the gates of which are DC biased to a certain potential value, and it is possible to realize the class AB bias.

Second Embodiment

Figure 9:
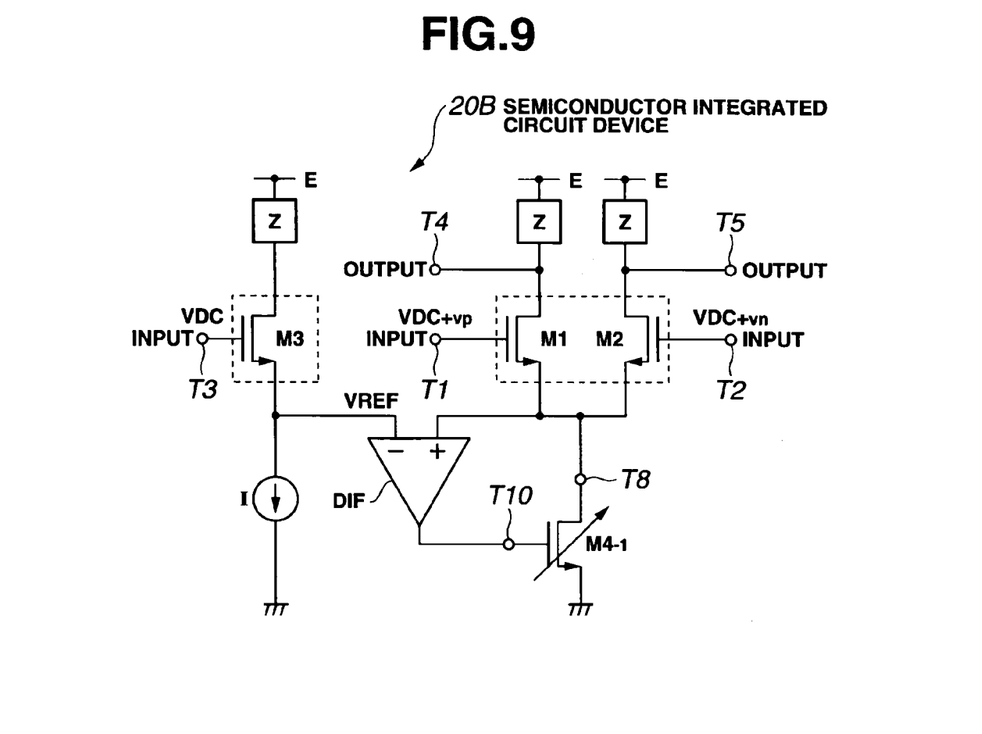
FIG. 9 is a circuit diagram of a semiconductor integrated circuit device according to a second embodiment of the present invention.

FIG. 9 is a circuit diagram of a semiconductor integrated circuit device according to a second embodiment of the present invention.

The semiconductor integrated circuit device 20B shown in FIG. 9 is different from the semiconductor integrated circuit device 20A shown in FIG. 2 in that a transistor is provided which is enabled to adjust the amount of increase in the drain current of the transistor M4 according to the increase in the input amplitude (see FIG. 5) by adjusting a portion equivalent to the size (such as the channel width) of the transistor M4, that is, a gm adjustable transistor M4-1 is provided. Thereby, as shown by the two-dot chain line of FIG. 5, the gm of the transistor M4 can be made variable by increasing or decreasing the DC current of the transistor M4.

Figure 10:
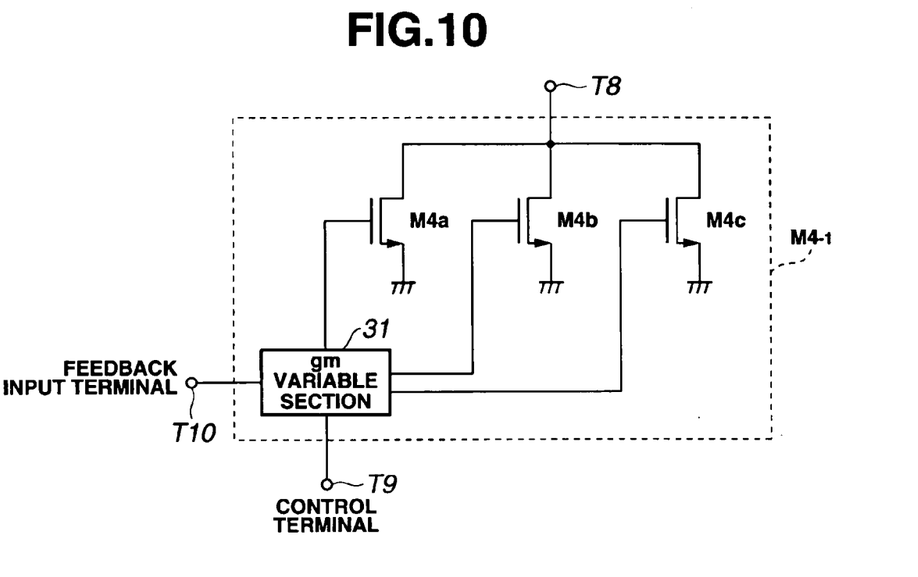
FIG. 10 is a diagram showing an example of a configuration of a transistor with adjustable gm.

FIG. 10 shows an example of a configuration of a gm adjustable transistor M4-1. The transistor M4-1 includes: a feedback input terminal T10 into which the difference signal from the differential amplifier DIF is inputted; a feedback output terminal T8; a control terminal T9 into which a control signal from a control unit (not shown) is inputted; a plurality of (for example, three) transistors M4a, M4b and M4c which are connected in parallel between the feedback output terminal T8 and the reference potential point; a gm variable section 31 which is provided between the feedback input terminal T10 and the gates of the three transistors M4a, M4b and M4c, and which according to the control signal from the control terminal T9, can select whether the difference signal from the feedback input terminal T10 is supplied only to the gate of the transistor M4a, or to the gate of the transistor M4a and the gate of the other transistor M4b, or to the gate of the transistor M4a and the gates of the other two transistors M4b and M4c.

In this configuration, the gm which is a characteristic parameter of the transistor M4-1 can be made variable in such a manner that according to the contents of the control signal from the control units (not shown), the gm variable section 31 selects, from the three gates of the three transistors M4a, M4b and M4c, a certain number of gates to which the difference signal from the differential amplifier DIF is inputted.

According to the second embodiment, the degree of increase in the output current according to the increase in the signal current of the main transistors M1 and M2 can be adjusted by adjusting the current flowing through the feedback control transistor M4-1. Thus, it is possible to adjust the distortion in the output of the amplifier circuit by varying the gm of the main transistors.

Third Embodiment

Figure 11:
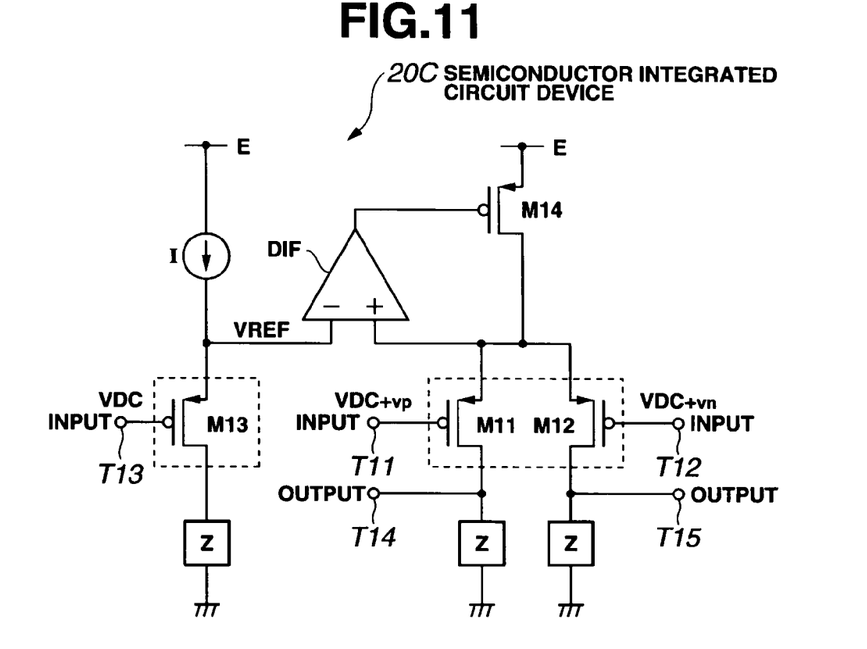
FIG. 11 is a block diagram of a semiconductor integrated circuit device according to a third embodiment of the present invention.

FIG. 11 is a block diagram of a semiconductor integrated circuit device according to a third embodiment of the present invention.

In the semiconductor integrated circuit device 20C shown in FIG. 11, are provided differential transistors M11 and M12 which form a differential pair as signal input transistors, the sources of which are connected to the drain of a transistor M14. A transistor M13 is a replica of the transistors M11 and M12. The source of the transistor M13 as the replica of the differential transistors M11 and M12 is connected to a current source I. The one end of the current source I is connected to a DC voltage source E. Note that all of the transistors M11 to M14 are P-channel FETs (for example, PMOS transistors).

The source of the transistor M13 and the common source of the differential transistors M11 and M12 are respectively connected to two input terminals of a differential amplifier DIF, and the output terminal of the differential amplifier DIF is connected to the gate of the transistor M14. That is, the source voltage of the transistor M13, and the source voltage of the differential transistors M11 and M12 are respectively inputted into ± input terminals of the differential amplifier DIF, and the difference output of the differential amplifier DIF is inputted into the gate of the transistor M14. The source of the transistor M14 is connected to the DC voltage source E. The drain of each of the transistors M11, M12 and M13 is connected to a reference potential point via a load Z. A DC bias (VDC) and each of AC signals (vp, vn) are inputted into each of the gates of the differential transistors M11 and M12. The same DC bias (VDC) as that inputted to the gate of the differential transistors M12 and M13 is inputted into the gate of the transistor M13. The VDC inputted into the transistor M13 is, for example, the common mode voltage of the preceding stage circuit.

The above described configuration shown in FIG. 11 is obtained in such a manner that the upper and lower sides in the configuration of the semiconductor integrated circuit device 20A shown in FIG. 2 are reversed, that the DC voltage source and the reference potential point are respectively replaced by the reference potential point and the DC voltage source, and that the N-channel FETs are replaced by the P-channel FETs. The operation of the semiconductor integrated circuit device 20C shown in FIG. 11 is the same as that of the semiconductor integrated circuit device 20A shown in FIG. 2.

According to the third embodiment, also in the semiconductor integrated circuit device using the P-channel FETs, for example, PMOS transistors, the source potential of the main transistors M11 and M12 is controlled by using the replica transistor M13 similarly to the first embodiment. Thereby, it is possible to secure desired transistor characteristics of the transistors of the amplifier circuit, and the like, the gates of which are DC biased to a certain value, and it is possible to realize the class AB bias.

Fourth Embodiment

Figure 12:
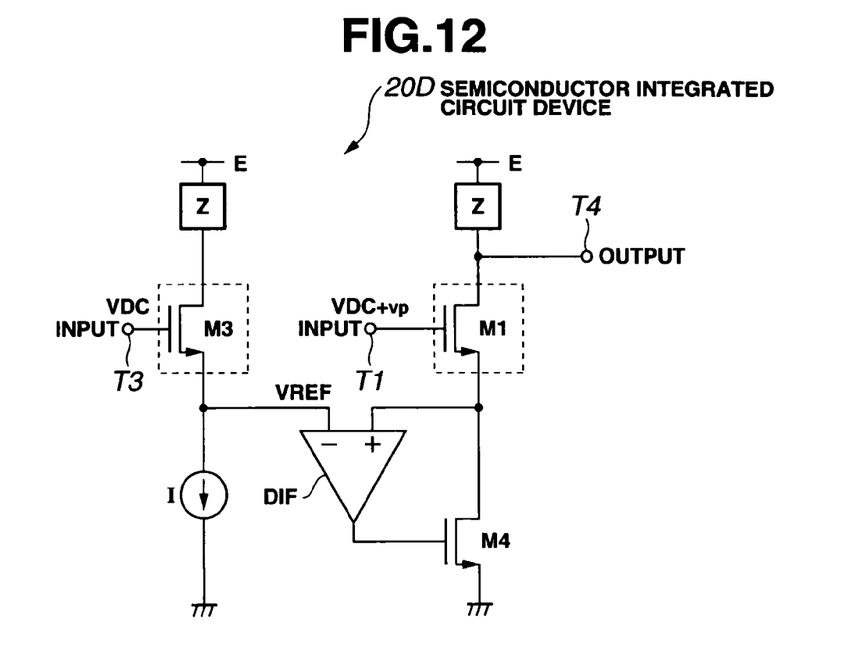
FIG. 12 is a block diagram of a semiconductor integrated circuit device according to a fourth embodiment of the present invention.

FIG. 12 is a block diagram of a semiconductor integrated circuit device according to a fourth embodiment of the present invention.

In the semiconductor integrated circuit device 20D shown in FIG. 12, the transistor M2 and the load Z for the transistor M2 are eliminated in the semiconductor integrated circuit device 2A shown in FIG. 2, and the amplifier circuit is configured only by the transistor M1 and the load Z for the transistor M1. Here, the transistor M3 is a replica of the transistor M1. That is, the transistor M3 is a replica which has the same DC characteristics as those of the transistor M1. The DC current flowing between the drain and source of the transistor M3 is equivalent to the DC current flowing between the drain and source of the transistor M1. The other configuration and operations are the same as those of the semiconductor integrated circuit device 2A shown in FIG. 2.

Figure 13:
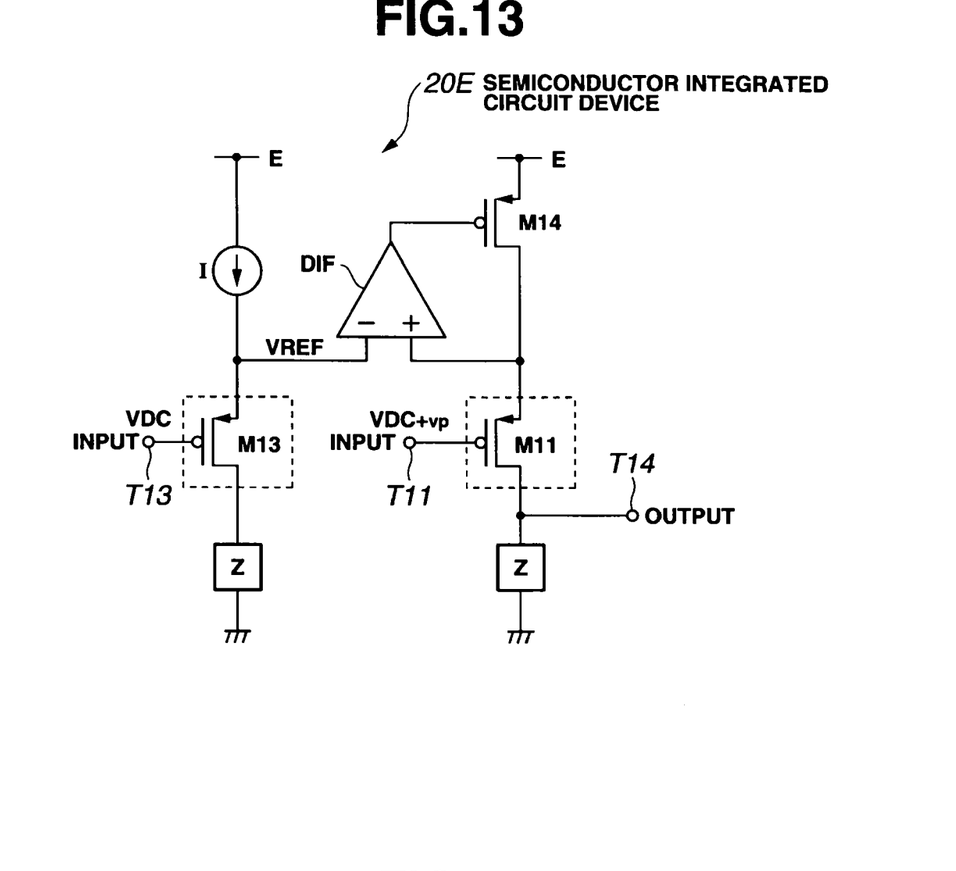
FIG. 13 is a diagram showing a configuration in which the upper and lower sides in FIG. 12 are reversed, and in which the N-channel FETs are replaced by P-channel FETs.

The semiconductor integrated circuit device 20E shown in FIG. 13 is obtained in such a manner that the upper and lower sides in the configuration of the semiconductor integrated circuit device 20D shown in FIG. 12 are reversed, that the DC voltage source and the reference potential point are respectively replaced by the reference potential point and the DC voltage source, and that the N-channel FETs are replaced by P-channel FETs.

According to the fourth embodiment, not only in the semiconductor integrated circuit device using the differential transistors, but also in the semiconductor integrated circuit device using one main transistor for signal amplification, the source potential of the main transistor M1 or M11 is controlled by using the replica transistor M3 or M13 similarly to the first and third embodiments. Thereby, it is possible to secure desired transistor characteristics of the transistor of the amplifier circuit, and the like, the gate of which is DC biased to a certain value, and it is possible to realize the class AB bias.

According to the present embodiments as described above, it is possible to provide a semiconductor integrated circuit device which is capable of securing desired transistor characteristics (such as gm) of transistors of an amplifier circuit, and the like, the gates of which are DC biased to a certain value, and it is possible to realize the class AB bias.

Having described the embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A semiconductor integrated circuit device comprising:
    an amplifier circuit which has one or more input terminals, one or more output terminals, and a first bias terminal, and in which a first current or voltage DC signal and a first current or voltage AC signal are superimposed on each other so as to be inputted into the one or more input terminals;
    a replica circuit which has the same DC characteristics as the DC characteristics of the amplifier circuit, to which a second current or voltage DC signal is inputted, and which has a second bias terminal;
    a reference voltage generation circuit which is connected to the second bias terminal of the replica circuit, and which generates a predetermined reference voltage at the second bias terminal; and
    a feedback circuit which takes a difference between the reference voltage generated at the second bias terminal of the replica circuit and the voltage generated at the first bias terminal of the amplifier circuit, and which performs feedback control by providing negative feedback of the difference to the first bias terminal of the amplifier circuit so that the voltage generated at the first bias terminal of the amplifier circuit is made equal to the reference voltage generated at the second bias terminal of the replica circuit.

2. The semiconductor integrated circuit device according to claim 1, wherein the reference voltage generation circuit is configured by a current source.

3. The semiconductor integrated circuit device according to claim 1,
    wherein the first current or voltage DC signal is a DC voltage having a predetermined value, and
    wherein the second current or voltage DC signal is a voltage equivalent to the DC voltage.

4. A semiconductor integrated circuit device comprising:
    an amplifier circuit that is configured by including first and second input terminals to which first and second input signals formed by respectively superimposing AC signals having opposite polarities on DC signals having the same level are respectively inputted, first and second transistors which form a differential pair in such a manner that the first and second input signals are respectively inputted into the gates of the transistors, and that the sources of the transistors are commonly connected, first and second loads, one ends of which are respectively connected to the drains of the first and second transistors, and the other ends of which are connected to a DC voltage source, and first and second output terminals which are respectively connected to the drains of the first and second transistors, so as to take out output signals;
    a replica circuit that is configured by including a third transistor, to the gate of which a DC signal having the same level as the DC component of the input signal inputted into the gates of the first and second transistors is inputted, and a third load, one end of which is connected to the drain of the third transistor, and the other end of which is connected to the DC voltage source, and that is configured such that the third transistor has the same DC characteristics as the DC characteristics of the first and second transistors of the amplifier circuit;
    a reference voltage generation circuit that is configured by a current source provided between the source of the third transistor of the replica circuit and a reference potential point, and that is configured to generate a reference voltage corresponding to the current source at a connection point of the source of the third transistor and the current source; and
    a feedback circuit that is configured by including a fourth transistor, the drain and source of which are respectively connected between the commonly connected sources of the first and second transistors of the amplifier circuit and the reference potential point, and which controls the current flowing between the drain and the source of the fourth transistor by a voltage inputted into the gate of the fourth transistor, and a differential circuit which takes a difference between the reference voltage generated at the source of the third transistor of the replica circuit and a voltage generated at the commonly connected sources of the first and second transistors of the amplifier circuit, and that is configured to perform negative feedback control by inputting the difference into the gate of the fourth transistor so that the voltage at the commonly connected sources of the first and second transistors is made equal to the reference voltage generated at the source of the third transistor of the replica circuit.

5. The semiconductor integrated circuit device according to claim 4, further comprising a circuit which makes variable the transconductance (gm) of the fourth transistor.

6. The semiconductor integrated circuit device according to claim 4,
    wherein the fourth transistor includes
    a plurality of transistors whose sources and drains are respectively connected in parallel between the commonly connected sources of the first and second transistors and the reference potential point, and
    a gm variable section which is provided between the output terminal of the differential circuit and the plurality of gates of the plurality of transistors, and which, according to a control signal, can select, from the plurality of transistors, a certain number of transistors to the gates of which the difference signal from the differential circuit is supplied.

7. The semiconductor integrated circuit device according to claim 4, wherein the DC bias state can be adjusted on the basis of the size ratio of the first and second transistors with respect to the third transistor.

8. The semiconductor integrated circuit device according to claim 4, wherein the DC voltage source and the reference potential point are respectively replaced by the reference potential point and the DC voltage source, and wherein the first to fourth transistors are configured by P-channel FETs.

9. The semiconductor integrated circuit device according to claim 4, wherein the replica circuit and the reference voltage generation circuit have a function to secure the DC characteristics of the first and second transistors of the amplifier circuit.

10. A semiconductor integrated circuit device comprising:
    an amplifier circuit that is configured by including a first input terminal to which a first input signal formed by superimposing a AC signal on a DC signal is inputted, a first transistor to the gate of which the first input signal is inputted, a first load one end of which is connected to the drain of the first transistor, and the other end of which is connected to a DC voltage source, and a first output terminal which is connected to the drain of the first transistor to take out an output signal;

a replica circuit that is configured by including a third transistor to the gate of which a DC signal of the same level as the DC component of the input signal inputted into the first transistor is inputted, and a third load one end of which is connected to the drain of the third transistor, and the other end of which is connected to the DC voltage source, and that is configured such that the third transistor has the same DC characteristics as the DC characteristics of the first transistor of the amplifier circuit;

a reference voltage generation circuit that is configured by a current source provided between the source of the third transistor of the replica circuit and a reference potential point, and that is configured to generate a reference voltage corresponding to the current source at a connection point of the source of third transistor and the current source; and a feedback circuit that is configured by including a fourth transistor, the drain and source of which are respectively connected between the source of the first transistor of the amplifier circuit and the reference potential point, and which controls the current flowing between the drain and source of the fourth transistor by a voltage inputted to the gate of the fourth transistor, and a differential circuit which takes a difference between the reference voltage generated at the source of the third transistor of the replica circuit and the voltage generated at the source of the first transistor of the amplifier circuit, and that is configured to perform negative feedback control by inputting the difference into the gate of the fourth transistor so that the source voltage of the first transistor is made equal to the reference voltage generated at the source of third transistor of the replica circuit.

11. The semiconductor integrated circuit device according to claim 10, wherein the DC voltage source and the reference potential point are respectively replaced by the reference potential point and the DC voltage source, and wherein the first, third and fourth transistors are configured by P-channel FETs.

* * * * *